(12) United States Patent
Lu et al.

(10) Patent No.: US 12,745,612 B2
(45) Date of Patent: Sep. 22, 2026

(54) METHODS AND STRUCTURES FOR IMPROVING ETCH PROFILE OF UNDERLYING LAYERS

(71) Applicant: Tokyo Electron Limited, Tokyo (JP)

(72) Inventors: Yen-Tien Lu, Tokyo (JP); Shihsheng Chang, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 404 days.

(21) Appl. No.: 18/235,796

(22) Filed: Aug. 18, 2023

(65) Prior Publication Data

US 2025/0062124 A1 Feb. 20, 2025

(51) Int. Cl.
*H10P 76/40* (2026.01)
*H10P 50/00* (2026.01)

(52) U.S. Cl.
CPC .......... *H10P 76/4085* (2026.01); *H10P 50/73* (2026.01); *H10P 76/405* (2026.01)

(58) Field of Classification Search
CPC ............. H01L 21/0337; H01L 21/0332; H01L 21/31144; H01L 21/31122; H10P 76/4085; H10P 76/405; H10P 50/73; H10P 50/285
See application file for complete search history.

(56) References Cited

U.S. PATENT DOCUMENTS 5,725,788 A * 3/1998 Maracas ............. H01L 21/0337 257/E21.232
6,033,984 A * 3/2000 Schnabel ................ H01L 24/13 257/E23.021
7,273,815 B2 * 9/2007 Sadjadi ............. H01L 21/31144 438/689
8,048,811 B2 * 11/2011 Feustel ............. H01L 21/76808 438/694
2008/0160766 A1 7/2008 Kim et al.
2009/0047789 A1 2/2009 Jung
2010/0330805 A1 12/2010 Doan et al.
2022/0181152 A1 * 6/2022 Sun ................... H01L 21/31116
2023/0245898 A1 8/2023 Niizeki et al.

FOREIGN PATENT DOCUMENTS

KR 10-2019-0085609 A 7/2019

* cited by examiner

*Primary Examiner* — Dale E Page
*Assistant Examiner* — Quovaunda Jefferson
(74) *Attorney, Agent, or Firm* — Foley & Lardner LLP

(57) ABSTRACT

Semiconductor devices and corresponding methods of manufacture are disclosed. The method includes forming a first hardmask layer over a substrate, forming a second hardmask layer over the first hardmask layer, etching the second hardmask layer to form a pattern in the second hardmask layer, transferring the pattern to the first hardmask layer, removing the second hardmask layer and trimming an upper portion of the pattern in the first hardmask layer, forming a silicon-containing layer on a top surface of the pattern in the first hardmask layer, and etching the substrate with the pattern in the first hardmask layer and the silicon-containing layer both serving as a mask.

20 Claims, 18 Drawing Sheets

400

505
510
505
510
505
510
505
400

400

400

400

1000

1000

1000

1000

1400

1400

1400

1400

METHODS AND STRUCTURES FOR IMPROVING ETCH PROFILE OF UNDERLYING LAYERS

FIELD OF THE DISCLOSURE

This disclosure generally relates to methods for fabricating semiconductor devices, and more particularly to trimming a hardmask layer for improving etched profile.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. While semiconductor devices have scaled down with their feature sizes decreased and aspect ratios increased, such scaling efforts are running into greater challenges as scaling enters single digit nanometer semiconductor device fabrication processes. Although nanoscale semiconductor fabrication processes have been successfully demonstrated and implemented, various embodiments can include numerous operations, and may include increasing stability of semiconductor device element or features.

SUMMARY

The present disclosure relates to methods and structures of improving etch profile of underlying layers. The methods disclosed herein may include trimming a hard mask layer, forming a silicon-containing layer, and/or forming a lining layer. The methods, structures, and techniques described herein provide improved etch profile in underlying layers, thereby enhancing the performance reliability of devices.

One aspect of the present disclosure can be directed to a method for fabricating semiconductor devices. The method may include forming a first hardmask layer over a substrate, forming a second hardmask layer over the first hardmask layer, etching the second hardmask layer to form a pattern in the second hardmask layer, transferring the pattern to the first hardmask layer, removing the second hardmask layer and trimming an upper portion of the pattern in the first hardmask layer, forming a silicon-containing layer on a top surface of the pattern in the first hardmask layer, and etching the substrate with the pattern in the first hardmask layer and the silicon-containing layer both serving as a mask.

In some examples, the substrate may include one or more dielectric layers, the first hardmask layer may include an amorphous carbon layer, and the second hardmask layer may include silicon oxynitride.

In some examples, the step of forming a silicon-containing layer on a top surface of the pattern in the first hardmask layer may include applying a plasma of silicon tetrachloride over the pattern in the first hardmask layer.

In some examples, the plasma of silicon tetrachloride may be applied with a passivation gas of hydrogen or oxygen.

In some examples, following the step of forming a silicon-containing layer on a top surface of the pattern in the first hardmask layer, the method may include forming an aluminum oxide layer lining the pattern in the first hardmask layer and the silicon-containing layer.

In some examples, the mask may include the aluminum oxide layer.

In some examples, the aluminum oxide layer may be formed using atomic layer deposition.

In some examples, prior to the step of forming a silicon-containing layer on a top surface of the pattern in the first hardmask layer, the method may include forming an aluminum oxide layer lining the pattern in the first hardmask layer.

In some examples, the mask may include the aluminum oxide layer.

In some examples, the aluminum oxide layer may be formed using atomic layer deposition.

Another aspect of the present disclosure can be directed to a method for fabricating semiconductor devices. The method may include forming a first hardmask layer over a substrate, forming a second hardmask layer over the first hardmask layer, transferring a pattern of the second hardmask layer to the first hardmask layer, removing the second hardmask layer and trimming an upper portion of the pattern in the first hardmask layer, forming a third hardmask layer on a top surface of the pattern in the first hardmask layer, and etching the substrate with the pattern in the first hardmask layer and the third hardmask layer both serving as a mask.

In some examples, the third hardmask layer may be formed based on a plasma of silicon tetrachloride.

In some examples, the substrate may include one or more dielectric layers, the first hardmask layer may include an amorphous carbon layer, the second hardmask layer may include silicon oxynitride, and the third hardmask layer may include silicon.

In some examples, following the step of forming a third hardmask layer on a top surface of the pattern in the first hardmask layer, the method may include forming an aluminum oxide layer lining the pattern in the first hardmask layer and the third hardmask layer.

In some examples, the mask may include the aluminum oxide layer.

In some examples, prior to the step of forming a third hardmask layer on a top surface of the pattern in the first hardmask layer, the method may include forming an aluminum oxide layer lining the pattern in the first hardmask layer.

In some examples, the mask may include the aluminum oxide layer.

Another aspect of the present disclosure can be directed to a method for fabricating semiconductor devices. The method may include forming an amorphous carbon layer over one or more dielectric layers, forming a patterned hardmask layer over the amorphous carbon layer, transferring a pattern of the patterned hardmask layer to the amorphous carbon layer, removing the patterned hardmask layer and trimming an upper portion of the pattern in the amorphous carbon layer, forming a silicon-containing layer on a top surface of the pattern in the amorphous carbon layer, and etching the one or more dielectric layers with the pattern in the amorphous carbon layer and the silicon-containing layer both serving as a mask.

In some examples, following the step of forming a silicon-containing layer on a top surface of the pattern in the amorphous carbon layer, the method may include forming an aluminum oxide layer lining the pattern in the amorphous carbon layer and the silicon-containing layer.

In some examples, prior to the step of forming a silicon-containing layer on a top surface of the pattern in the amorphous carbon layer, the method may include forming an aluminum oxide layer lining the pattern in the amorphous carbon layer.

The order of discussion of the different steps as described herein has been presented for clarity's sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

These and other aspects and implementations are discussed in detail below. The foregoing information and the following detailed description include illustrative examples of various aspects and implementations and provide an overview or framework for understanding the nature and character of the claimed aspects and implementations. The drawings provide illustrations and a further understanding of the various aspects and implementations and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
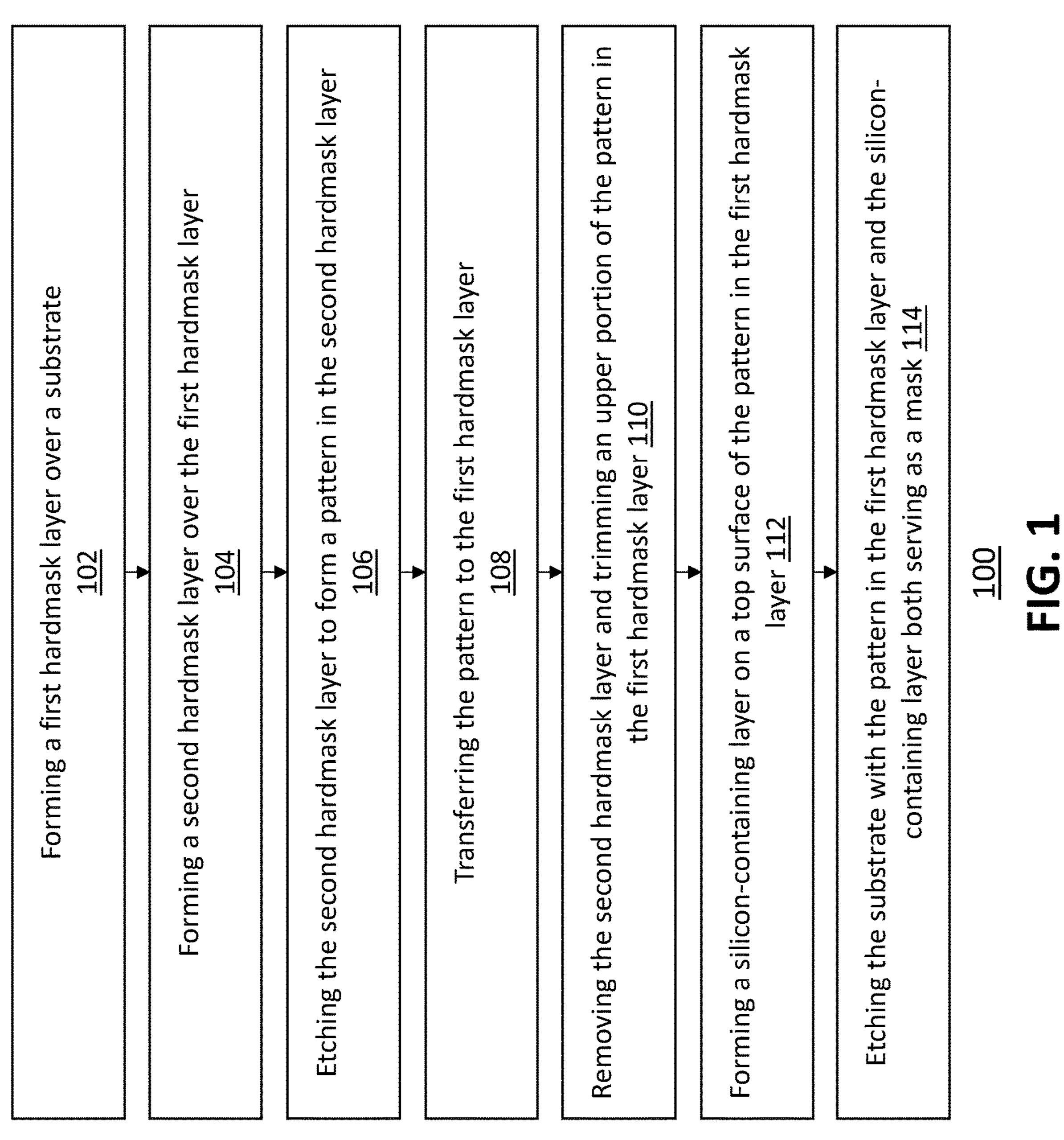
FIG. 1 shows a flow chart of a method for fabricating a semiconductor device, according to an embodiment.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Techniques herein include methods and devices for improving etch profile of underlying layers in a semiconductor device. Specifically, techniques include trimming a hard mask layer, forming a silicon-containing layer, and/or forming a lining layer. This allows for additional hardmask margin for etching an underlying layer (e.g., a substrate, a dielectric, etc.) while reducing a bowing profile associated with the hard mask. Accordingly, etch profile with high aspect ratio and enhanced performance reliability can be achieved with such techniques. Techniques herein can be used during in-situ and ex-situ processes, which allows for flexible application of such techniques. For example, techniques described herein can be applied to various dielectric etch processes and applications, for example in fabrication processes of memory and logic devices.

Reference will now be made to the figures, which for the convenience of visualizing the fabrication techniques described herein, illustrate a variety of materials undergoing a process flow in various views. Unless expressly indicated otherwise, each Figure represents one (or a set) of fabrication steps in a process flow for manufacturing the devices described herein. In the various views of the Figures, connections between conductive layers or materials may or may not be shown. However, it should be understood that connections between various layers, masks, or materials may be implemented in any configuration to create electric or electronic circuits. When such connections are shown, it should be understood that such connections are merely illustrative and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, the techniques described herein may be implemented in any shape or geometry for any material or layer to achieve desired results. In addition, examples in which two transistors or devices are shown stacked on top of one another are shown for illustrative purposes only, and for the purposes of simplicity. Indeed, the techniques described herein may provide for one to any number of stacked devices. Further, although the devices fabricated using these techniques are shown as transistors, it should be understood that any type of electric electronic device may be manufactured using such techniques, including but not limited to transistors, variable resistors, resistors, and capacitors.

FIG. 1 illustrates a flow chart of a method 100 for fabricating a semiconductor device, in accordance with some embodiments. It is noted that the method 100 is merely an example, and is not intended to limit the present disclosure. Accordingly, it is understood that additional operations may be provided before, during, and after the method 100 of FIG. 1, that any operation may be omitted, and that some other operations may only be briefly described herein.

In various embodiments, operations of the method 100 may be associated with cross-sectional views of an example structure at various fabrication stages as shown in FIGS. 4 to 9, which will be discussed in further detail below. It should be understood that the structure, shown in FIGS. 4 to 9, may include a number of other structures, while remaining within the scope of the present disclosure.

In brief overview, the method 100 starts with operation 102 of forming a first hardmask layer over a substrate. The method 100 continues to operation 104 of forming a second hardmask layer over the first hardmask layer. The method 100 can proceed to operation 106 of etching the second hardmask layer to form a pattern in the second hardmask layer. The method 100 can proceed to operation 108 of transferring the pattern to the first hardmask layer. The method 100 can proceed to operation 110 of removing the second hardmask layer and trimming an upper portion of the pattern in the first hardmask layer. The method 100 can proceed to operation 112 of forming a silicon-containing layer on a top surface of the pattern in the first hardmask layer. The method 100 can proceed to operation 114 of etching the substrate with the pattern in the first hardmask layer and the silicon-containing layer both serving as a mask.

Figure 4:
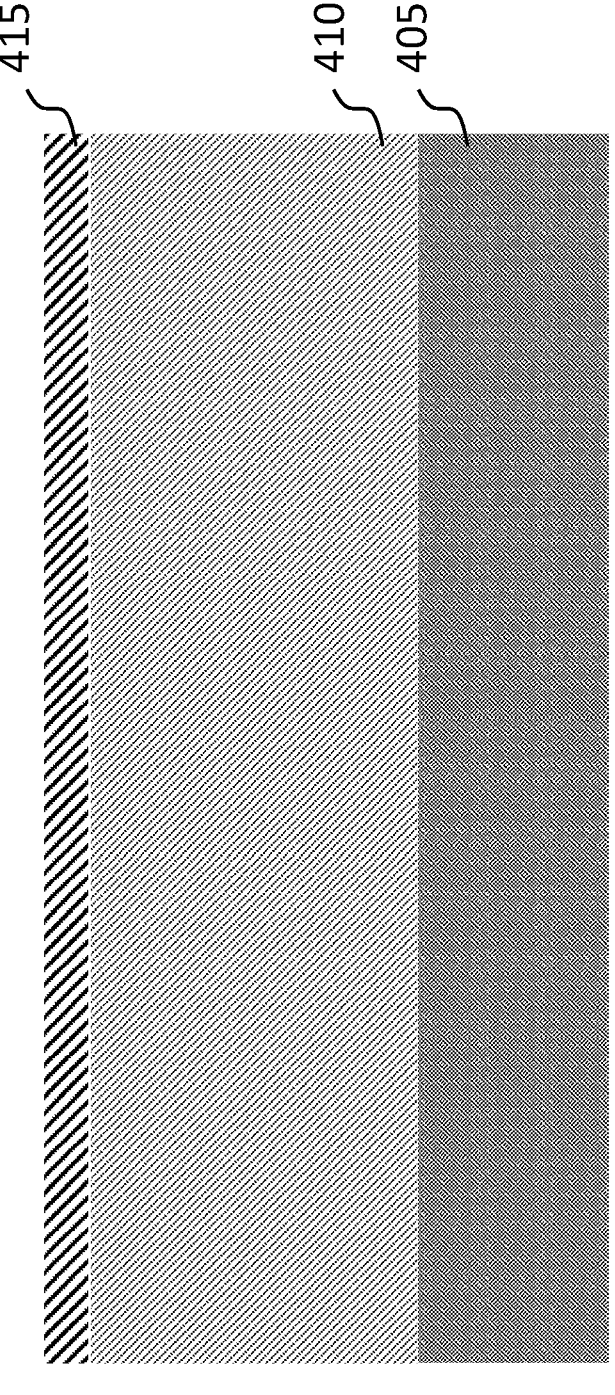
FIGS. 4-18 show views of a semiconductor device during various fabrication stages, according to some embodiments.

Corresponding to operation 102 of FIG. 1, FIG. 4 is a cross-sectional view of a structure 400 in which a first hardmask layer 410 of a first material is formed over a substrate 405. In some embodiments, the substrate 405 may serve as a target to be patterned, while the first hardmask layer 410 and the second hardmask layer 415 may collectively serve as a patterned mask to transfer their pattern to the underlying substrate 405. For example, the substrate 405 may be a semiconductor substrate, such as a bulk semiconductor, a semiconductor-on-insulator (SOI) substrate, or the like, which may be doped (e.g., with a p-type or an n-type dopant) or undoped. The substrate 405 may be a wafer, such as a silicon wafer. Other substrates, such as a multi-layered or gradient substrate may also be used. In another example, the substrate 405 may be an intermetal dielectric (e.g., silicon oxide or otherwise low-k dielectric material). In yet another example, the structure 400 may be a portion of a 3D NAND memory device, and the substrate 405 may include a stack of different dielectric materials (e.g., oxide-nitride-oxide-nitride (ONON)) alternately arranged on top of one another. The thickness of such a stack layer may vary. For example, the thickness of the ONON layer may be around 8 μm.

The first hardmask layer 410 of the first material can be formed over the substrate 405. In some examples, the first hardmask layer 410 can be spin-coated, placed, grown (e.g., epitaxially with or without a seed layer), or otherwise formed over the substrate 405. The first hardmask layer 410 may be or include a light-sensitive material (e.g., photoresist) configured to pattern the substrate 405. In some examples, the first hardmask layer 410 may be or include an amorphous carbon layer (ACL) or amorphous carbon. In some examples, the first hardmask layer 410 may be or include an amorphous silicon layer or amorphous silicon. In some examples, the first hardmask layer 410 may be or include an organic dielectric layer or organic dielectric. The thickness of the first hardmask layer 410 may vary. In some examples, the first hardmask layer 410 may be thicker than the second hardmask layer 415. As a non-limiting example, the thickness of the first hardmask layer 410 may be around 3 μm.

According to various examples, the formation of the one or more layers of the structure 400 can include planarization of the layers, such as by cutting, ablation, chemical mechanical grinding or polishing (CMG/P), or other planarization techniques.

Corresponding to operation 104 of FIG. 1, FIG. 4 is a cross-sectional view of the structure 400 in which a second hardmask layer 415 of a second material is formed over the first hardmask layer 410, in accordance with various embodiments. The second hardmask layer 415 of the second material can be formed over the first hardmask layer 410. In some examples, the second hardmask layer 415 can be spin-coated, placed, grown (e.g., epitaxially with or without a seed layer), or otherwise formed over the first hardmask layer 410. The second hardmask layer 415 may be or include a light-sensitive material (e.g., photoresist) configured to pattern the first hardmask layer 410. In some examples, the second hardmask layer 415 may be or include silicon oxynitride or such a layer. The thickness of the second hardmask layer 415 may vary. In some examples, the second hardmask layer 415 may be thinner than the first hardmask layer 410. As a non-limiting example, the thickness of the second hardmask layer 415 may be around 0.3 μm.

Figure 5:
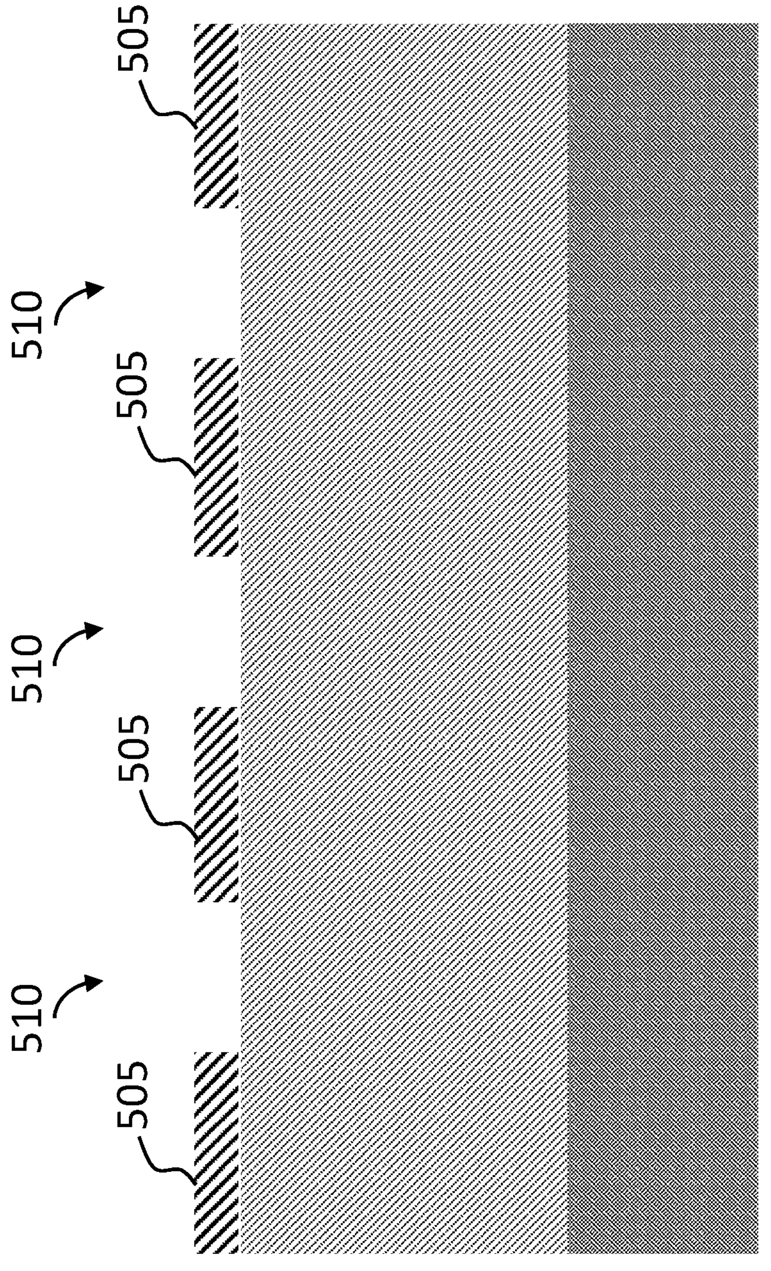

Corresponding to operation 106 of FIG. 1, FIG. 5 is a cross-sectional view of the structure 400 in which the second hardmask layer 415 is etched to form a pattern in the second hardmask layer 415, in accordance with various embodiments. For example, as shown in FIG. 5, the patterned second hardmask layer 415 (hereinafter referred to as a first patterned feature 505) may be formed. For example, the first patterned feature 505 may be formed by directionally etching an etched portion 510 of the second hardmask layer 415 toward the top of the first hardmask layer 410. In some examples, the operation 106 may be omitted, when for example, the second hardmask layer 415 is a pre-patterned or a patterned layer.

Figure 6:
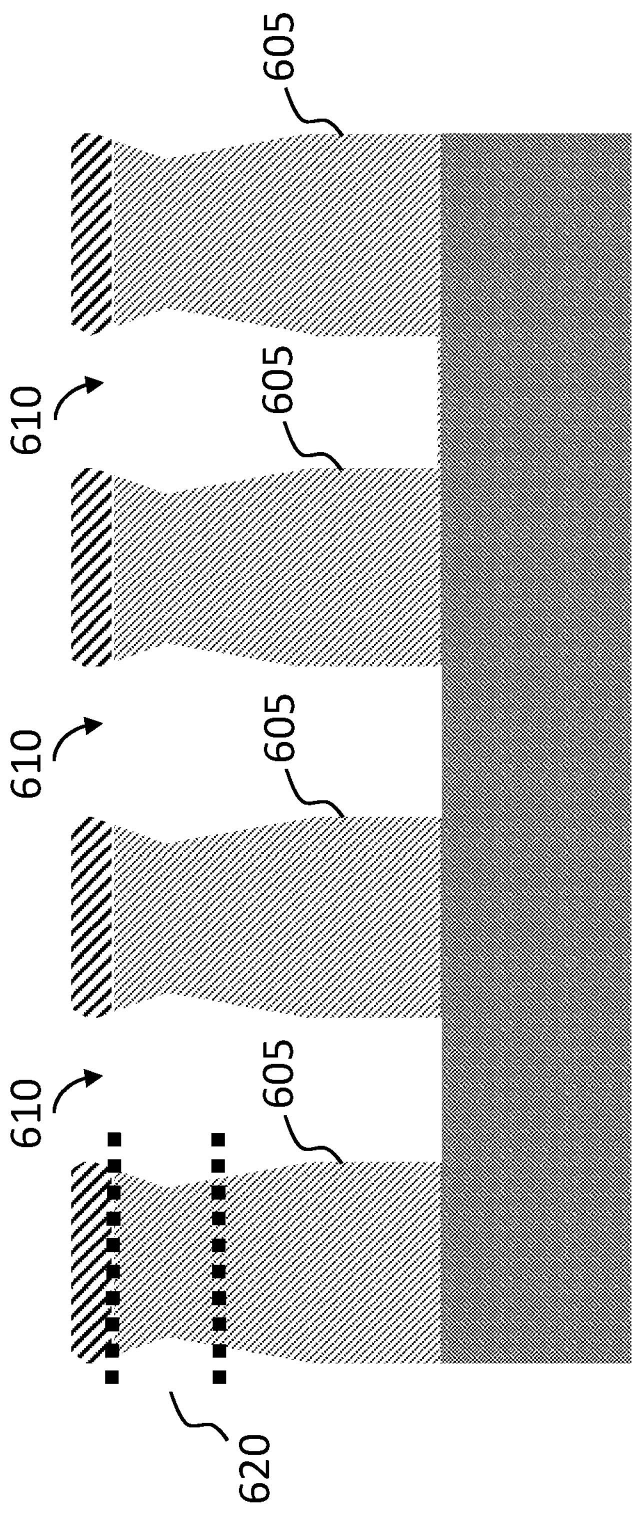

Corresponding to operation 108 of FIG. 1, FIG. 6 is a cross-sectional view of the structure 400 in which the pattern of the first patterned feature 505 is transferred to the first hardmask layer 410, in accordance with various embodiments. For example, as shown in FIG. 6, the patterned first hardmask layer 410 (hereinafter referred to as a second patterned feature 605) can be formed. For example, the second patterned feature 605 may be formed by directionally etching an etched portion 610 of the first hardmask layer 410 toward the top of the substrate 405.

In some embodiments, the second hardmask layer 415 may be patterned to selectively etch the first hardmask layer 410 and form one or more protruding structures (e.g., the second patterned feature 605). In some embodiments, a patterned material may be formed as the second hardmask layer 415 over the first hardmask layer 410, and the first hardmask layer 410 may be etched to form a pattern (e.g., the second patterned feature 605). An upper portion of the second patterned feature 605 may include a bowing portion 620. For example, a bow depth of the bowing portion 620 may be 100-200 nm.

Figure 7:
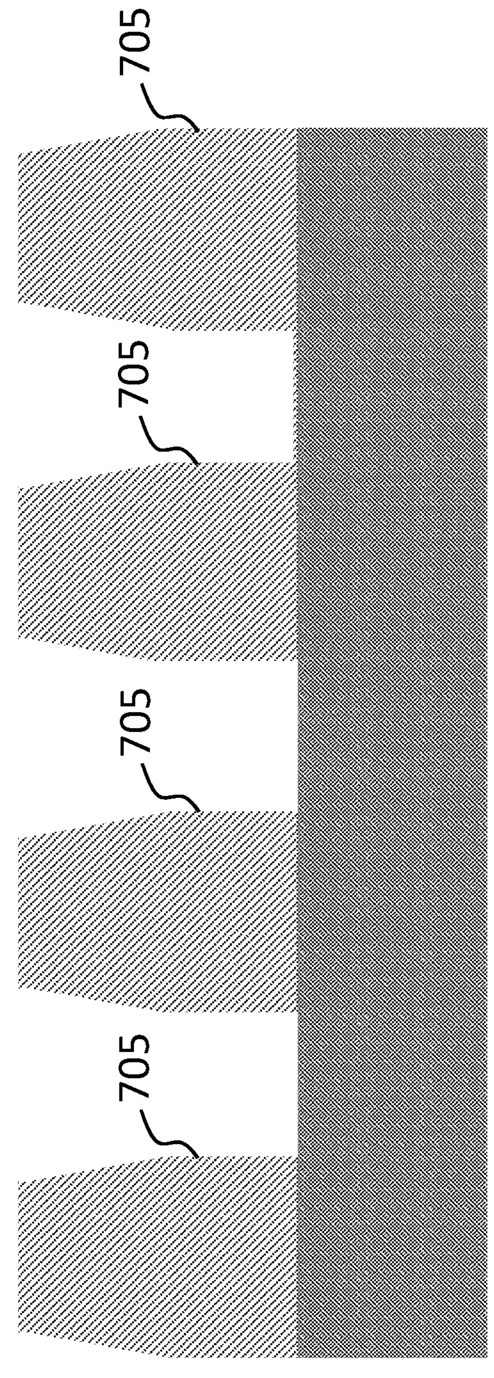

Corresponding to operation 110 of FIG. 1, FIG. 7 is a cross-sectional view of the structure 400 in which the first patterned feature 505 is removed, and an upper portion of the second patterned feature 605 in the first hardmask layer 410 is trimmed (or a portion of the second patterned feature 605 in the first hardmask layer 410 is removed), in accordance with various embodiments. As shown in FIG. 7, the bowing portion 620 in the upper portion of the second patterned feature 605 can be thereby removed, and a trimmed feature 705 is formed. In some examples, a directional etching (e.g., downward) may be performed to remove the first patterned feature 505 and a portion of the second patterned feature 605 to form the trimmed feature 705. In some examples, a low bias power can be used to etch at least one of the first patterned feature 505 or the upper portion of the second patterned feature 605.

Figure 8:
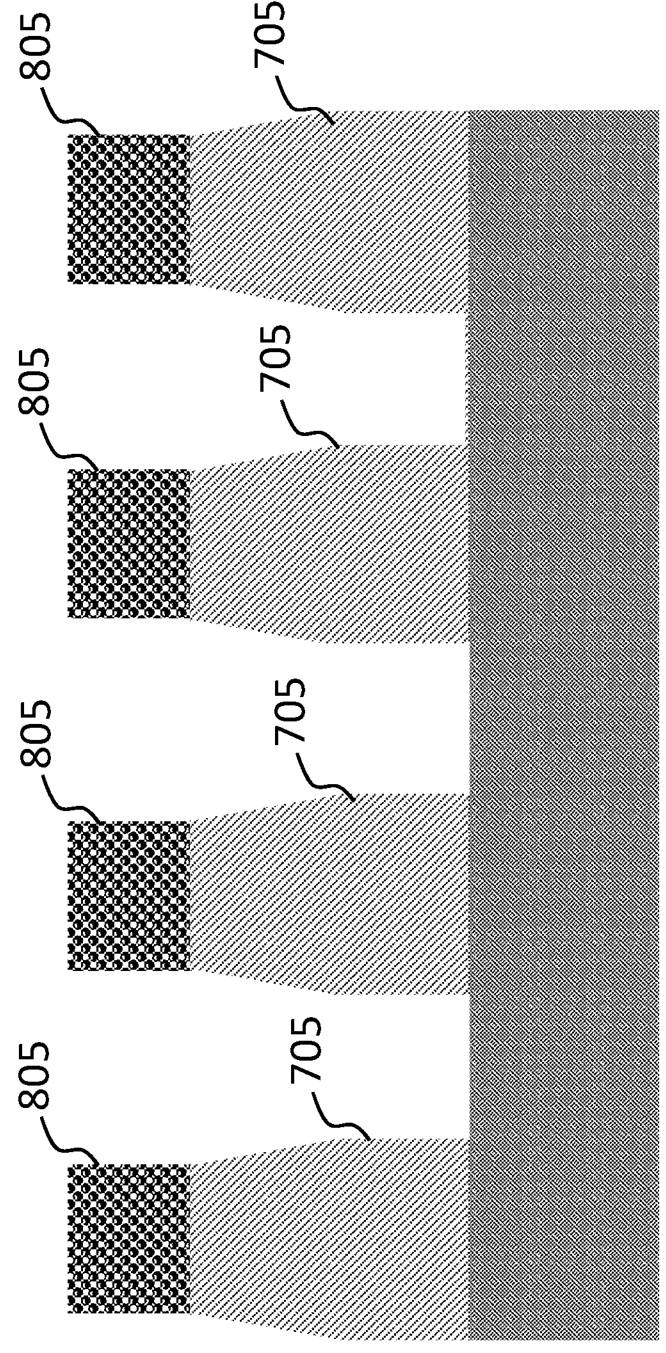

Corresponding to operation 112 of FIG. 1, FIG. 8 is a cross-sectional view of the structure 400 in which a top feature 805 is formed on a top surface of the trimmed feature 705, in accordance with various embodiments. In some examples, the top feature 805 may be or include a silicon-containing material. The top feature 805 may be formed by depositing a silicon-containing material with at least one of silicon-containing precursors (e.g., $SiF_4$, $SiCl_4$, etc.). For example, silicon tetrachloride plasma can be used to deposit a silicon-containing layer. In some examples, the silicon tetrachloride plasma can be applied with a passivation gas of hydrogen or oxygen. In some embodiments, the thickness of the top feature 805 may vary. For example, the thickness of the top feature 805 formed on the top surface of the trimmed feature 705 may be, but not limited to, from 10 nm to 50 nm. For example, the thickness of the top feature 805 may be 10 nm, 30 nm, or 50 nm.

Although depicted as a single layer in FIG. 8, it should be understood that the top feature 805 may be formed to have one or more layers while remaining within the scope of the present disclosure. For example, in some embodiments, the top feature 805 may include a first top layer of a first top material and a second top layer of a second top material.

Any deposition method may be used to form the top feature 805, including but not limited to, chemical vapor deposition (CVD), physical vapor deposition (PVD), plasma enhanced CVD (PECVD), molecular beam epitaxy (MBE), metal organic CVD (MOCVD), or the like. The dimensions, shapes, and formation methods of the top feature 805 described herein are merely non-limiting examples, and other embodiments may be possible. These and other variations are fully intended to be included within the scope of the present disclosure.

Figure 9:
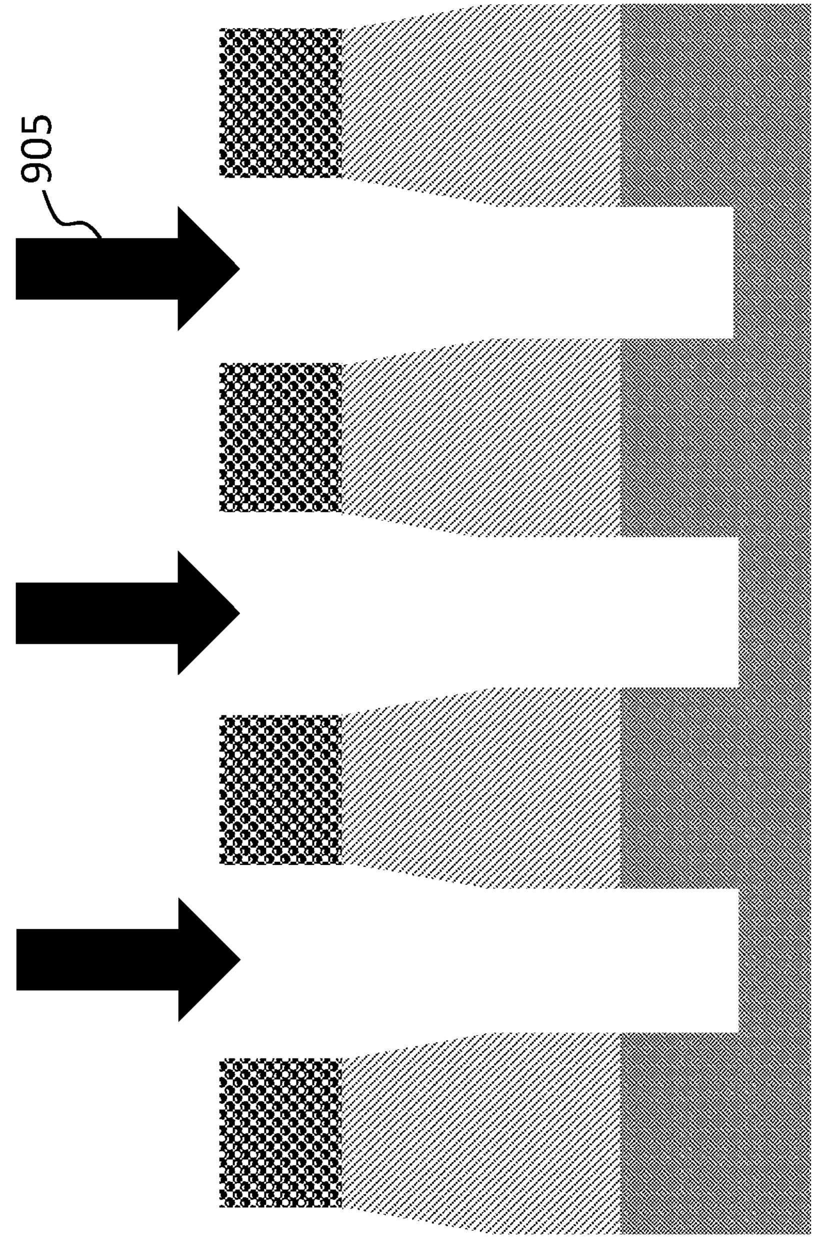

Corresponding to operation 114 of FIG. 1, FIG. 9 is a cross-sectional view of the structure 400 in which an underlying layer is etched with the trimmed feature 705 and the top feature 805 both serving as a mask, in accordance with various embodiments. As shown in FIG. 9, an etching process 905 may be performed to etch an underlying layer with the trimmed feature 705 and the top feature 805 both serving as a mask. In some embodiments, the underlying layer is a substrate 405 and the etching process 905 can be performed to etch the substrate 405. In some embodiments, the etching process 905 may be performed to etch one or more underlying layers (e.g., a dielectric layer) formed on the substrate 405. In some examples, following the etching process 905, one or more etching processes (e.g., wet etching, dry etching, etc.) may be used to remove the top feature 805.

In some examples, the substrate 405 may have different configurations for different applications, and the trimmed feature 705 and the top feature 805 may serve as a mask to etch the substrate 405 with various configurations or one or more underlying layers formed on such a substrate. For example, the substrate 405 may have a stack of layers alternately formed of different materials. For example, the structure 400 may be a portion of a 3D NAND memory device, in which the substrate 405 may include a stack of oxide-nitride-oxide layers. In some examples, the etching process 905 may be anisotropic or isotropic.

The top feature 805 formed on the top surface of the trimmed feature 705 can improve a roughness of the top surface of the trimmed feature 705 and/or the profile thereof. For example, during various stages of the fabrication, the top surface of the trimmed feature 705 may include a dip or a rough portion. The top feature 805 can fill up such a dip or rough portion, thereby improving the roughness of the top surface of the trimmed feature 705 and/or the profile thereof. In some examples, the top feature 805 allows for further modulation of the top surface of the trimmed feature 705. For example, the trimmed feature 705 (e.g., an upper portion thereof) can be modulated to be less tapered by forming the top feature 805 on the trimmed feature 705. In some examples, when the upper portion of the second patterned feature 605 is not trimmed (or the trimming is not enough) while the first patterned feature 505 is removed (e.g., at operation 110), the upper portion of the second patterned feature 605 may still remain tapered or include an undesirable feature. The formation of the top feature 805 can address such a tapered or otherwise undesirable feature and improve the profile of the trimmed feature 705. This allows for an improved etch profile (e.g., a straighter etch profile) in the substrate and/or a dielectric layer thereon.

Figure 2:
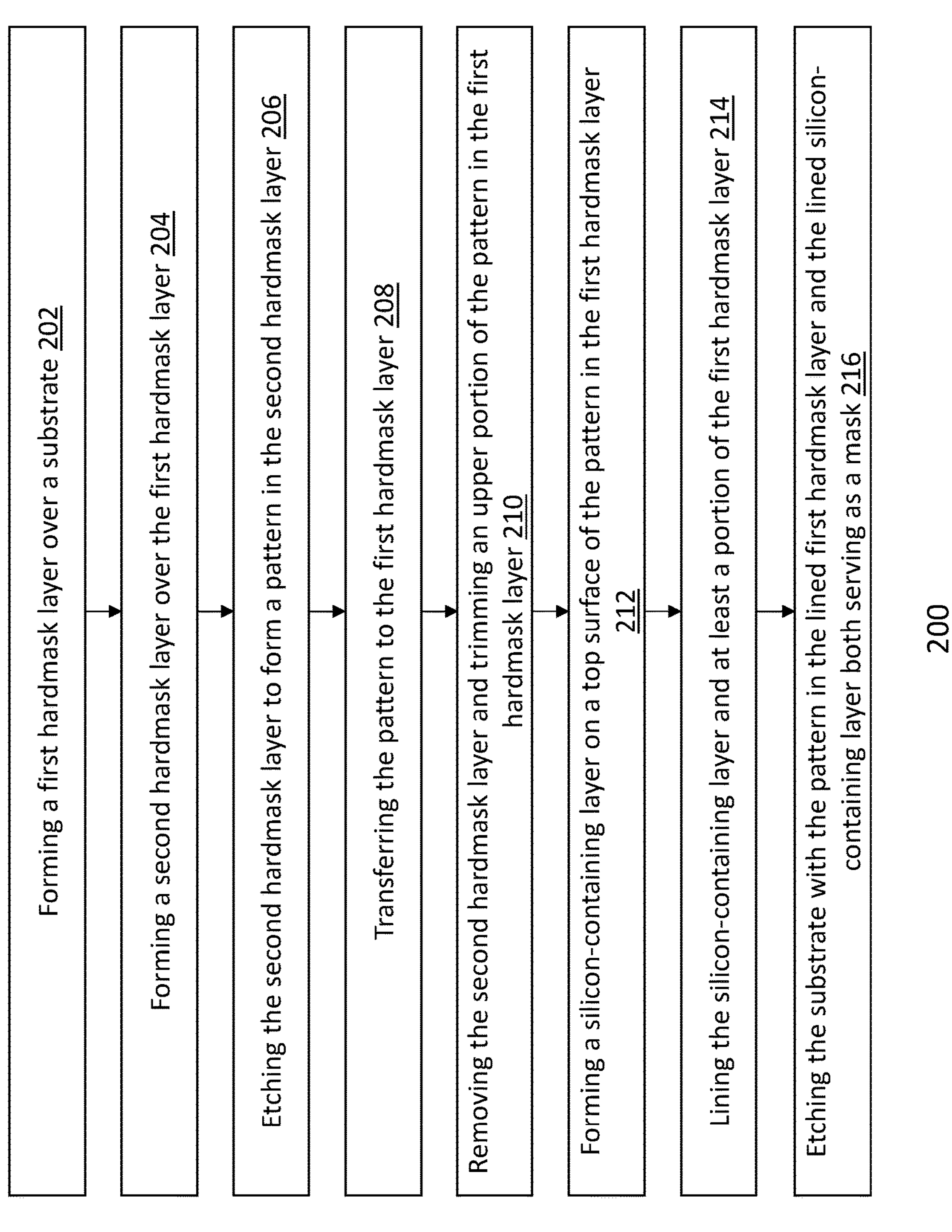
FIG. 2 shows a flow chart of a method for fabricating a semiconductor device, according to an embodiment.

Now referring to FIG. 2, a flow chart of a method 200 for fabricating a semiconductor device is illustrated, in accordance with some embodiments. It is noted that the method 200 is merely an example, and is not intended to limit the present disclosure. Accordingly, it is understood that additional operations may be provided before, during, and after the method 200 of FIG. 2, that any operation may be omitted, and that some other operations may only be briefly described herein.

In various embodiments, operations of the method 200 may be associated with cross-sectional views of an example structure at various fabrication stages as shown in FIGS. 10 to 13, which will be discussed in further detail below. It should be understood that the structure, shown in FIGS. 10 to 13, may include a number of other structures, while remaining within the scope of the present disclosure.

In brief overview, the method 200 starts with operation 202 of forming a first hardmask layer over a substrate. The method 200 continues to operation 204 of forming a second hardmask layer over the first hardmask layer. The method 200 can proceed to operation 206 of etching the second hardmask layer to form a pattern in the second hardmask layer. The method 200 can proceed to operation 208 of transferring the pattern to the first hardmask layer. The method 200 can proceed to operation 210 of removing the second hardmask layer. The method 200 can proceed to operation 212 of forming a silicon-containing layer on a top surface of the pattern in the first hardmask layer. The method 200 can proceed to operation 214 of lining the silicon-containing layer and at least a portion of the first hardmask layer. The method 200 can proceed to operation 216 of etching the substrate with the pattern in the lined first hardmask layer and the lined silicon-containing layer both serving as a mask.

Figure 10:
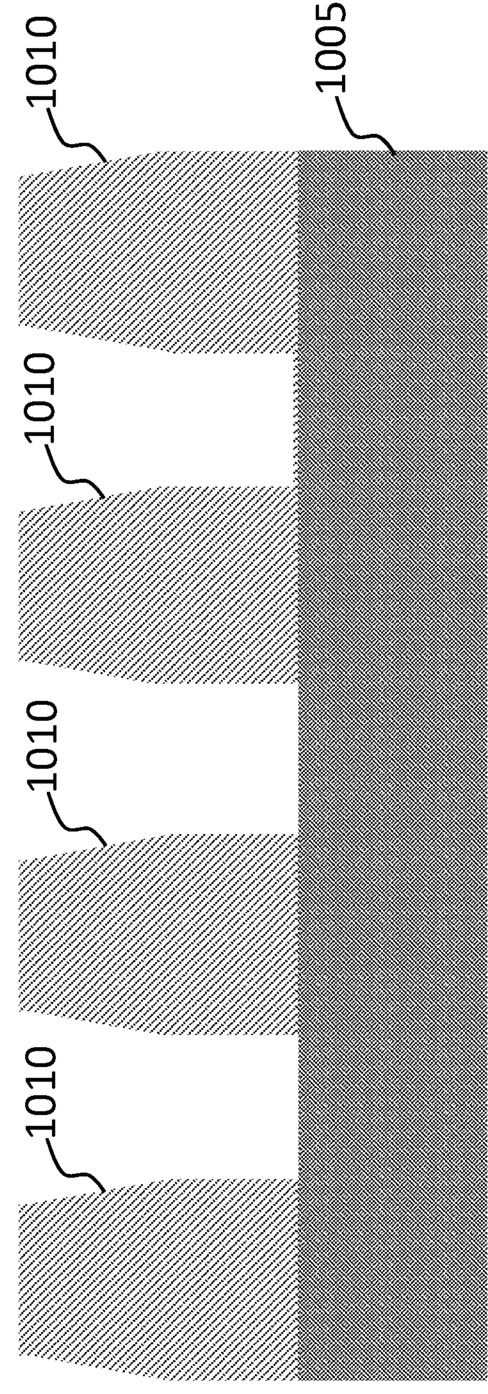

Operations 202, 204, 206, 208, 210 of the method 200 in FIG. 2 may be substantially similar to or identical to operations 102, 104, 106, 108, 110 of the method 100 in FIG. 1, respectively, according to various examples. Referring to FIG. 10, a structure 1000 may be substantially similar to or identical to the structure 400 shown in FIG. 7, according to various examples. For example, the structure 1000 shown in FIG. 10 may be a structure in which operations 202, 204, 206, 208, 210 of the method 200 (or operations 102, 104, 106, 108, 110 of the method 100, respectively) have been performed. As shown in FIG. 10, the structure 1000 includes a substrate 1005 and a trimmed feature 1010. The structure 1000 and the trimmed feature 1010 may be substantially similar to or identical to the substrate 405 and the trimmed feature 705 shown in FIG. 7, respectively, according to various examples.

Figure 11:
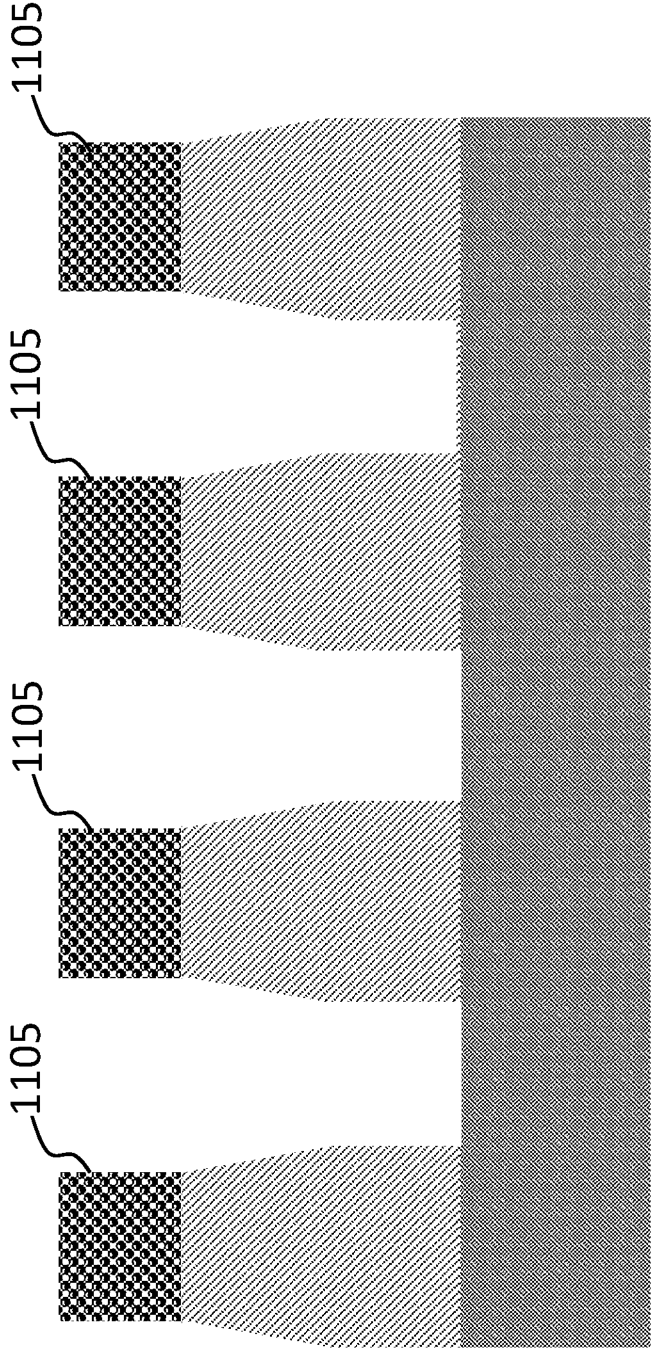

Corresponding to operation 212 of FIG. 2, FIG. 11 is a cross-sectional view of the structure 1000 in which a top feature 1105 is formed on a top surface of the trimmed feature 1010, in accordance with various embodiments. The top feature 1105 may be substantially similar to or identical to the top feature 805 shown in FIG. 8, and operation 212 may be substantially similar to or identical to operation 112 of the method 100 in FIG. 1, according to various examples. For example, the structure 1000 shown in FIG. 11 may be a structure in which operation 212 of the method 200 (or operation 112 of the method 100) have been performed on the structure 1000 shown in FIG. 10. For example, the top feature 1105 may be or include a silicon-containing material. The top feature 1105 may be formed by depositing a silicon-containing material with at least one of silicon-containing precursors (e.g., $SiF_4$, $SiCl_4$, etc.). For example, silicon tetrachloride plasma can be used to deposit a silicon-containing layer. In some examples, the silicon tetrachloride plasma can be applied with a passivation gas of hydrogen or oxygen. In some embodiments, the thickness of the top feature 1105 may vary. For example, the thickness of the top feature 1105 formed on the top surface of the trimmed feature 1010 may be, but not limited to, from 10 nm to 50 nm. For example, the thickness of the top feature 805 may be 10 nm, 30 nm, or 50 nm.

Figure 12:
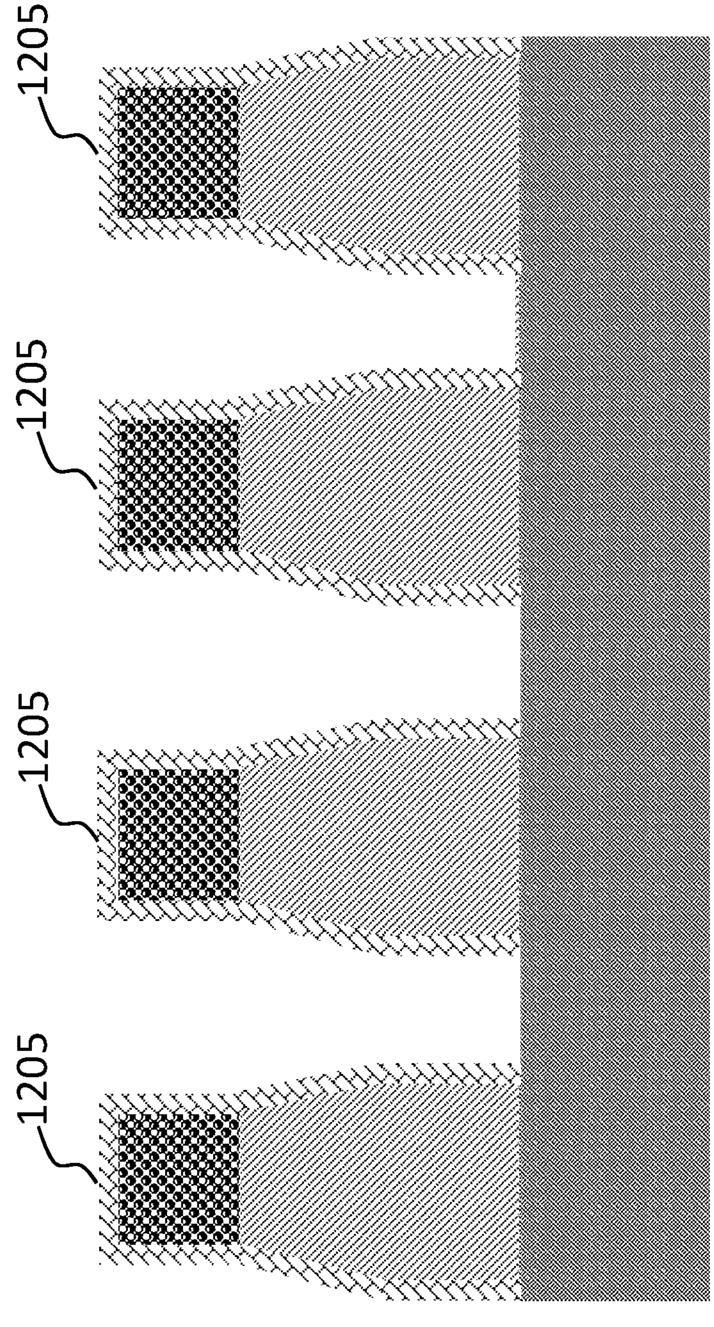

Corresponding to operation 214 of FIG. 2, FIG. 12 is a cross-sectional view of the structure 1000 in which at least a portion of the top feature 1105 and the trimmed feature 1010 is lined with a lining layer 1205 of a lining material, in accordance with various embodiments. As shown in FIG. 12, the lining layer 1205 may be formed over the top feature 1105 and the trimmed feature 1010. More specifically, the lining layer 1205 may be formed such that the top and sidewalls of the top feature 1105 and the sidewalls of the trimmed feature 1010 can be covered with the lining layer 1205.

The lining material may be or include, but not limited to, aluminum oxide, silicon oxide (e.g., $SiO_2$), titanium oxide (e.g., $TiO_2$), or any material that can protect the profile of the trimmed feature 1010 from damaging (e.g., damaging from fluorine-based etchant). The thickness of the lining layer 1205 may be equal to or less than about 15 nanometers (nm) or range from 5 nm to 15 nm. For example, the thickness of the lining layer 1205 may be 5 nm, 10 nm, or 15 nm. In some embodiments, the thickness of the lining layer 1205 may vary across the structure 1000. For example, the thickness of the lining layer 1205 formed on the top surface of the top feature 1105 may be thicker (or thinner) than that formed on the sidewalls of the top feature 1105 or that formed over the trimmed feature 1010. In some embodiments, the lining layer 1205 may be in-situ deposited.

Although the lining layer 1205 is depicted as a single layer in FIG. 12, it should be understood that the lining layer 1205 may be formed to have one or more layers while remaining within the scope of the present disclosure. For example, in some embodiments, the lining layer 1205 may include a first lining layer of a first lining material and a second lining layer of a second material. For example, in some embodiments, the lining layer 1205 may have different portions each of which has a different thickness. Any deposition method may be used to form the lining layer 1205, including but not limited to, atomic layer deposition (ALD), chemical vapor deposition (CVD), physical vapor deposition (PVD), plasma enhanced CVD (PECVD), molecular beam epitaxy (MBE), metal organic CVD (MOCVD), or the like. The dimensions, shapes, and formation methods of the lining layer 1205 described herein are merely non-limiting examples, and other embodiments may be possible. These and other variations are fully intended to be included within the scope of the present disclosure.

Figure 13:
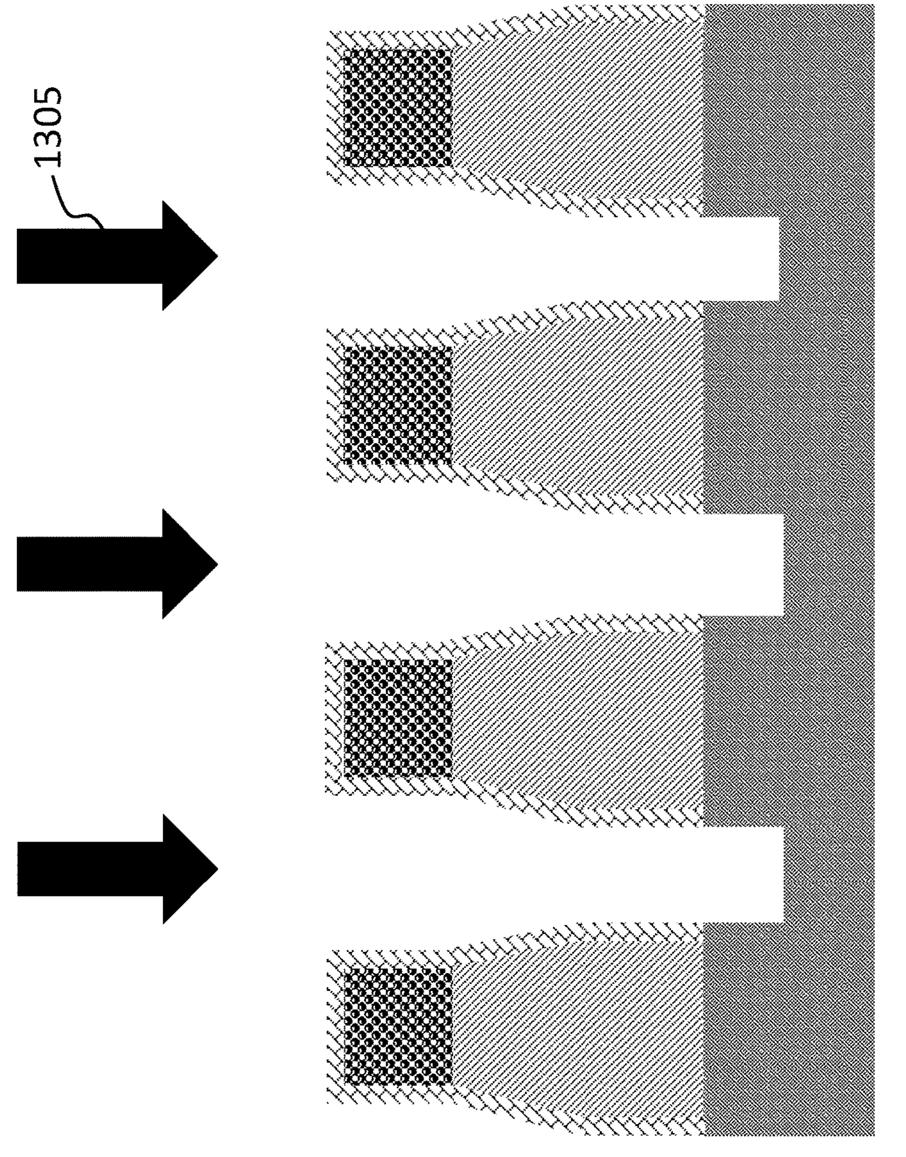

Corresponding to operation 216 of FIG. 2, FIG. 13 is a cross-sectional view of a structure 1000 in which an underlying layer is etched with the lining layer 1205 (or the structure including the trimmed feature 1010, the top feature 1105, and the lining layer 1205) serving as a mask, in accordance with various embodiments. As shown in FIG. 13, an etching process 1305 may be performed to etch an underlying layer with the lining layer 1205 (or the structure including the trimmed feature 1010, the top feature 1105, and the lining layer 1205) serving as a mask. In some embodiments, the etching process 1305 may be performed to etch the substrate 1005. In some embodiments, the etching process 1305 may be performed to etch one or more underlying layers (e.g., a dielectric layer) formed on the substrate 1005. In some examples, following the etching process 1305, one or more etching processes (e.g., wet etching, dry etching, etc.) may be used to remove the top feature 1105 and the lining layer 1205.

The lining layer 1205 can provide protection for one or more underlying layers (e.g., the top feature 1105, the trimmed feature 1010) during the etching process 1305. The lining layer 1205 can prevent the top feature 1105 and the trimmed feature 1010 from being etched when the etching process 1305 etches the substrate 1005 and/or a dielectric thereon. For example, the etching process 1305 may include applying etchants such as carbon/fluorine-based gasses, and the lining layer 1205 can protect the top feature 1105 and the trimmed feature 1010 from being damaged/etched by the etchants. This allows for an improved etch profile (e.g., a straighter etch profile) in the substrate and/or a dielectric layer thereon.

Figure 3:
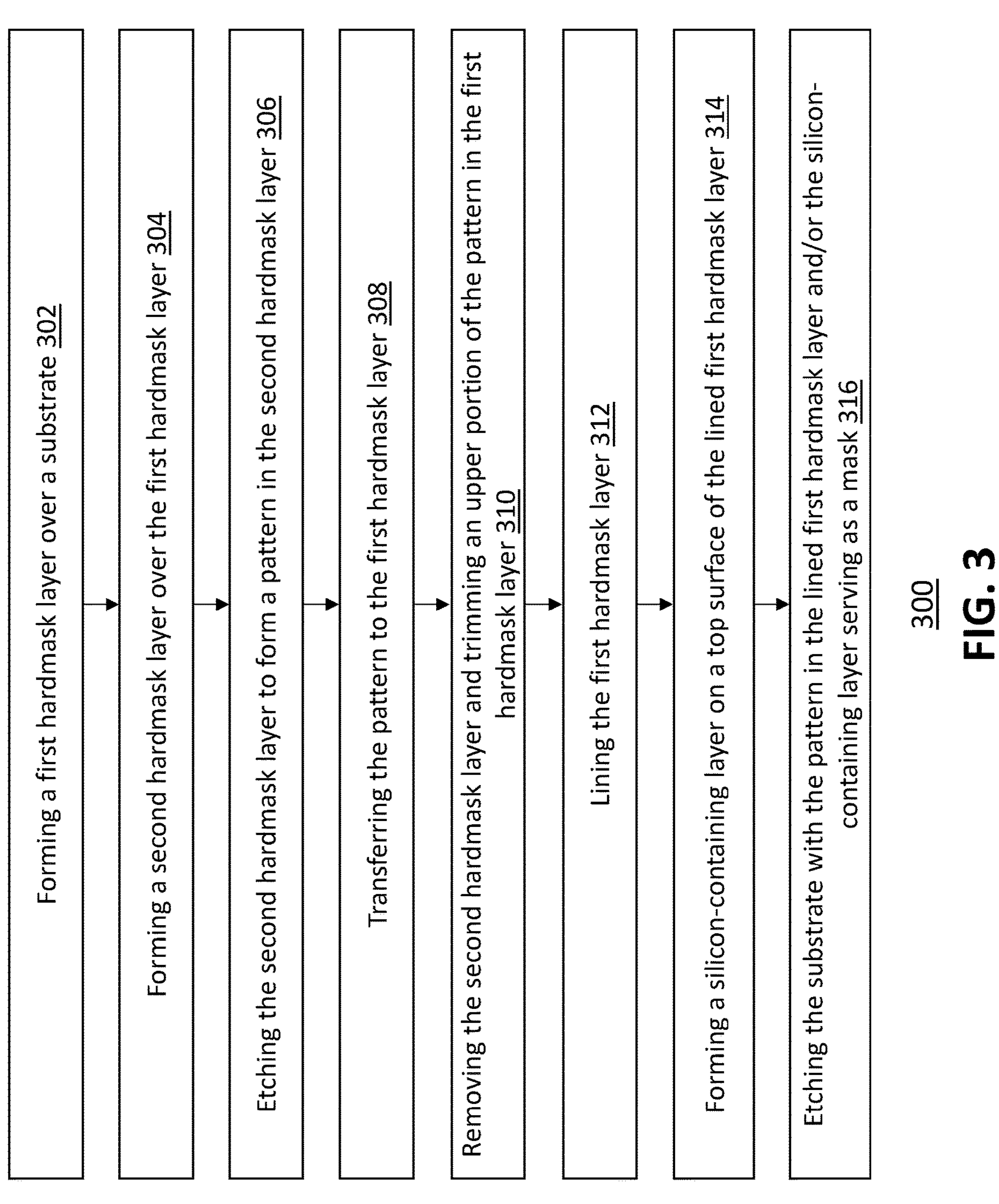
FIG. 3 shows a flow chart of a method for fabricating a semiconductor device, according to an embodiment.

Now referring to FIG. 3, a flow chart of a method 300 for fabricating a semiconductor device is illustrated, in accordance with some embodiments. It is noted that the method 300 is merely an example and is not intended to limit the present disclosure. Accordingly, it is understood that additional operations may be provided before, during, and after the method 300 of FIG. 3, that any operation may be omitted, and that some other operations may only be briefly described herein.

In various embodiments, operations of the method 300 may be associated with cross-sectional views of an example structure at various fabrication stages as shown in FIGS. 14 to 18, which will be discussed in further detail below. It should be understood that the structure, shown in FIGS. 14 to 18, may include a number of other structures, while remaining within the scope of the present disclosure.

In brief overview, the method 300 starts with operation 302 of forming a first hardmask layer over a substrate. The method 300 continues to operation 304 of forming a second hardmask layer over the first hardmask layer. The method 300 can proceed to operation 306 of etching the second hardmask layer to form a pattern in the second hardmask layer. The method 300 can proceed to operation 308 of transferring the pattern to the first hardmask layer. The method 300 can proceed to operation 310 of removing the second hardmask layer and trimming an upper portion of the pattern in the first hardmask layer. The method 300 can proceed to operation 312 of lining the first hardmask layer. The method 300 can proceed to operation 314 of forming a silicon-containing layer on a top surface of the lined first hardmask layer. The method 300 can proceed to operation 316 of etching the substrate with the pattern in the lined first hardmask layer and the silicon-containing layer both serving as a mask.

Figure 14:
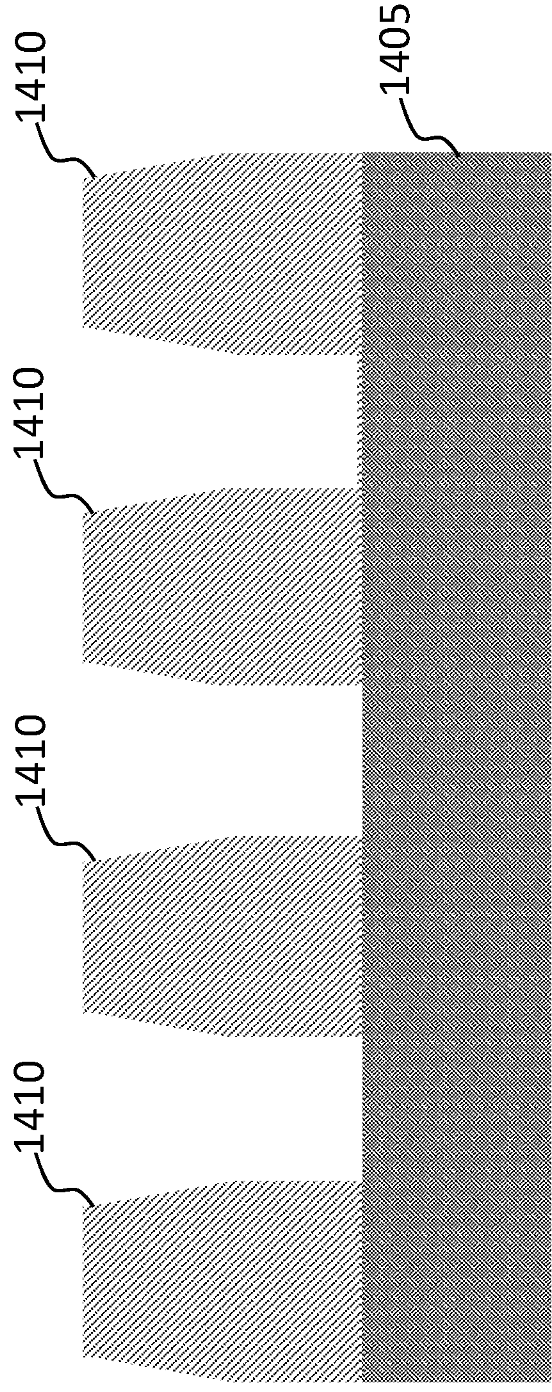

Operations 302, 304, 306, 308, 310 of the method 300 in FIG. 3 may be substantially similar to or identical to operations 102, 104, 106, 108, 110 of the method 100 in FIG. 1, respectively, according to various examples. Referring to FIG. 14, a structure 1400 may be substantially similar to or identical to the structure 400 shown in FIG. 7, according to various examples. For example, the structure 1400 shown in FIG. 14 may be a structure in which operations 302, 304, 306, 308, 310 of the method 300 (or operations 102, 104, 106, 108, 110 of the method 100, respectively) have been performed. As shown in FIG. 14, the structure 1400 includes a substrate 1405 and a trimmed feature 1410. The structure 1400 and the trimmed feature 1410 may be substantially similar to or identical to the substrate 405 and the trimmed feature 705 shown in FIG. 7, respectively, according to various examples.

Figure 15:
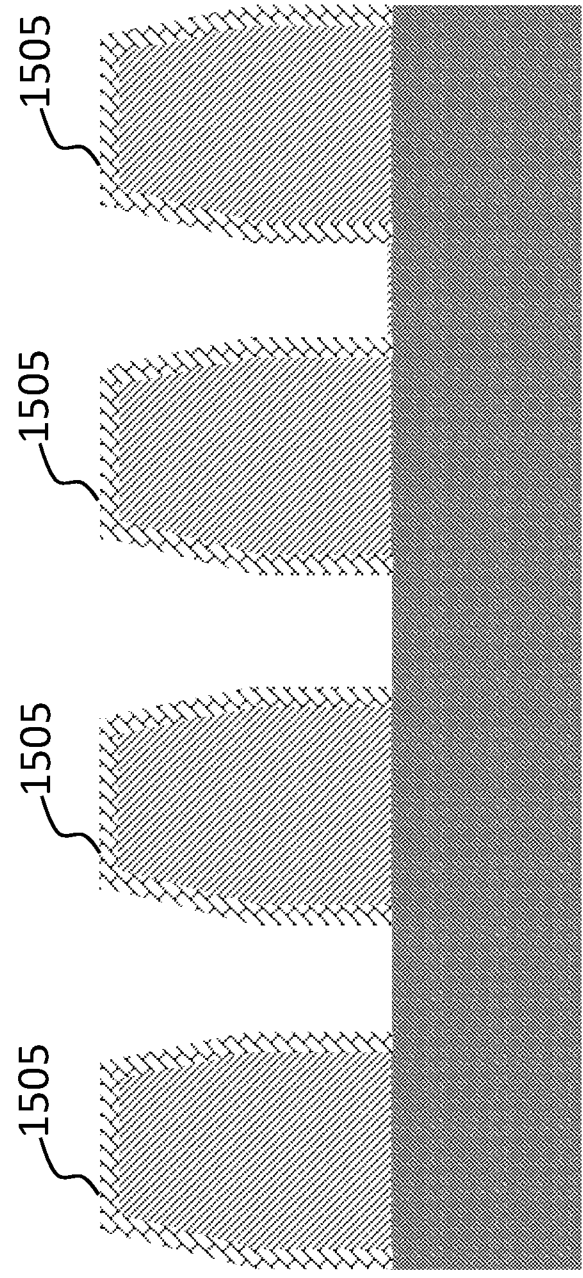

Corresponding to operation 312 of FIG. 3, FIG. 15 is a cross-sectional view of the structure 1400 in which the trimmed feature 1410 is lined with a lining layer 1505 of a lining material, in accordance with various embodiments. As shown in FIG. 15, the lining layer 1505 may be formed over the trimmed feature 1410. More specifically, the lining layer 1505 may be formed such that the top and sidewalls of the trimmed feature 1410 can be covered with the lining layer 1505. The lining material may be or include, but not limited to, aluminum oxide, silicon oxide (e.g., $SiO_2$), titanium oxide (e.g., $TiO_2$), or any material that can protect the profile of the trimmed feature 1410 from damaging (e.g., damaging from fluorine-based etchant). The thickness of the lining layer 1505 may be equal to or less than about 15 nanometers (nm) or range from 5 nm to 15 nm. For example, the thickness of the lining layer 1505 may be 5 nm, 10 nm, or 15 nm. In some embodiments, the thickness of the lining layer 1505 may vary across the structure 1400. For example, the thickness of the lining layer 1505 formed on the top surface of the trimmed feature 1410 may be different from that formed on the sidewalls of the trimmed feature 1410. In some embodiments, the lining layer 1505 may be in-situ deposited.

Although the lining layer 1505 is depicted as a single layer in FIG. 15, it should be understood that the lining layer 1505 may be formed to have one or more layers while remaining within the scope of the present disclosure. For example, in some embodiments, the lining layer 1505 may include a first lining layer of a first lining material and a second lining layer of a second material. For example, in some embodiments, the lining layer 1505 may have different portions each of which has a different thickness. Any deposition method may be used to form the lining layer 1505, including but not limited to, atomic layer deposition (ALD), chemical vapor deposition (CVD), physical vapor deposition (PVD), plasma enhanced CVD (PECVD), molecular beam epitaxy (MBE), metal organic CVD (MOCVD), or the like. The dimensions, shapes, and formation methods of the lining layer 1505 described herein are merely non-limiting examples, and other embodiments may be possible. These and other variations are fully intended to be included within the scope of the present disclosure.

Figure 16:
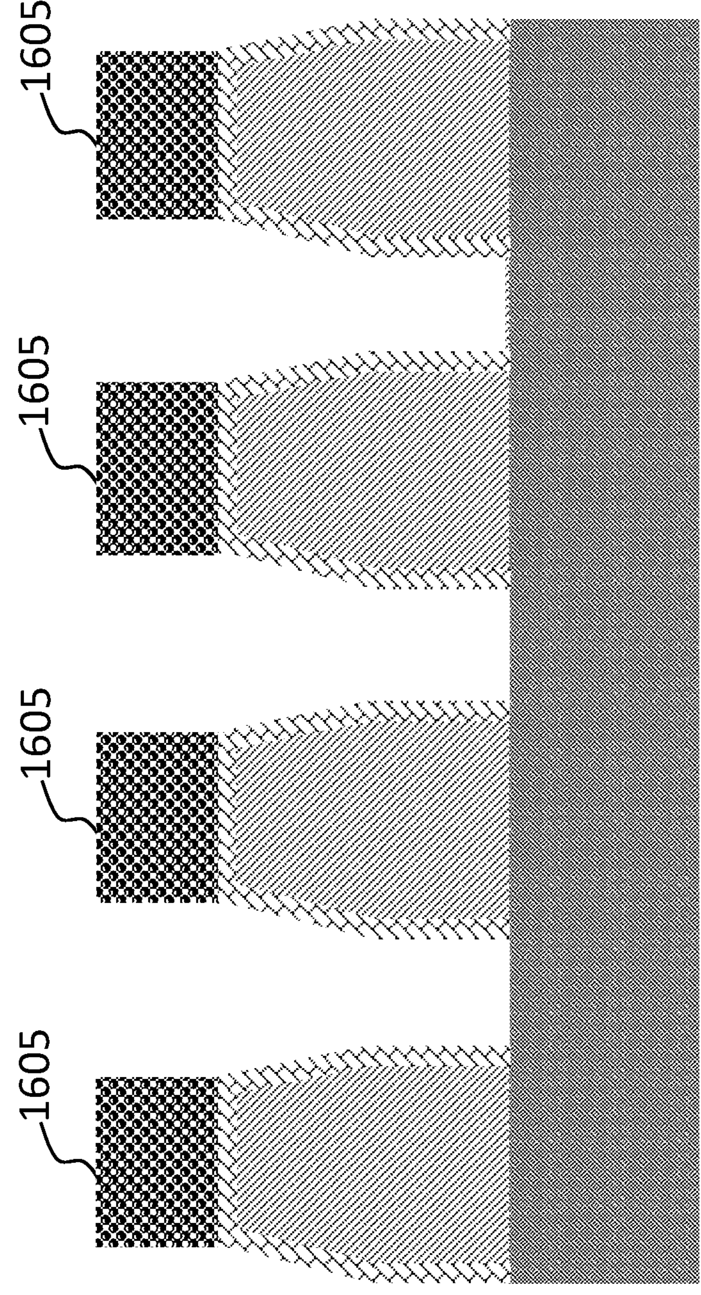

Corresponding to operation 314 of FIG. 3, FIG. 16 is a cross-sectional view of the structure 1400 in which a top feature 1605 is formed on a top surface of the lined trimmed feature 1410, in accordance with various embodiments. In some examples, operation 314 may be omitted as discussed in greater detail with respect to FIG. 18.

The top feature 1605 may be or include a silicon-containing material. The top feature 1605 may be formed on the lined trimmed feature 1410 by depositing a silicon-containing material with at least one of silicon-containing precursors (e.g., $SiF_4$, $SiCl_4$, etc.). For example, silicon tetrachloride plasma can be used to deposit a silicon-containing layer as the top feature 1605. In some examples, the silicon tetrachloride plasma can be applied with a passivation gas of hydrogen or oxygen. In some embodiments, the thickness of the top feature 1605 may vary. For example, the thickness of the top feature 1605 formed on the top surface of the lined trimmed feature 1410 may be from 10 nm to 50 nm. For example, the thickness of the top feature 1605 may be 10 nm, 30 nm, or 50 nm.

Although depicted as a single layer in FIG. 16, it should be understood that the top feature 1605 may be formed to have one or more layers while remaining within the scope of the present disclosure. For example, in some embodiments, the top feature 1605 may include a first top layer of a first top material and a second top layer of a second top material.

Any deposition method may be used to form the top feature 1605, including but not limited to, chemical vapor deposition (CVD), physical vapor deposition (PVD), plasma enhanced CVD (PECVD), molecular beam epitaxy (MBE), metal organic CVD (MOCVD), or the like. The dimensions, shapes, and formation methods of the top feature 1605 described herein are merely non-limiting examples, and other embodiments may be possible. These and other variations are fully intended to be included within the scope of the present disclosure.

Figure 17:
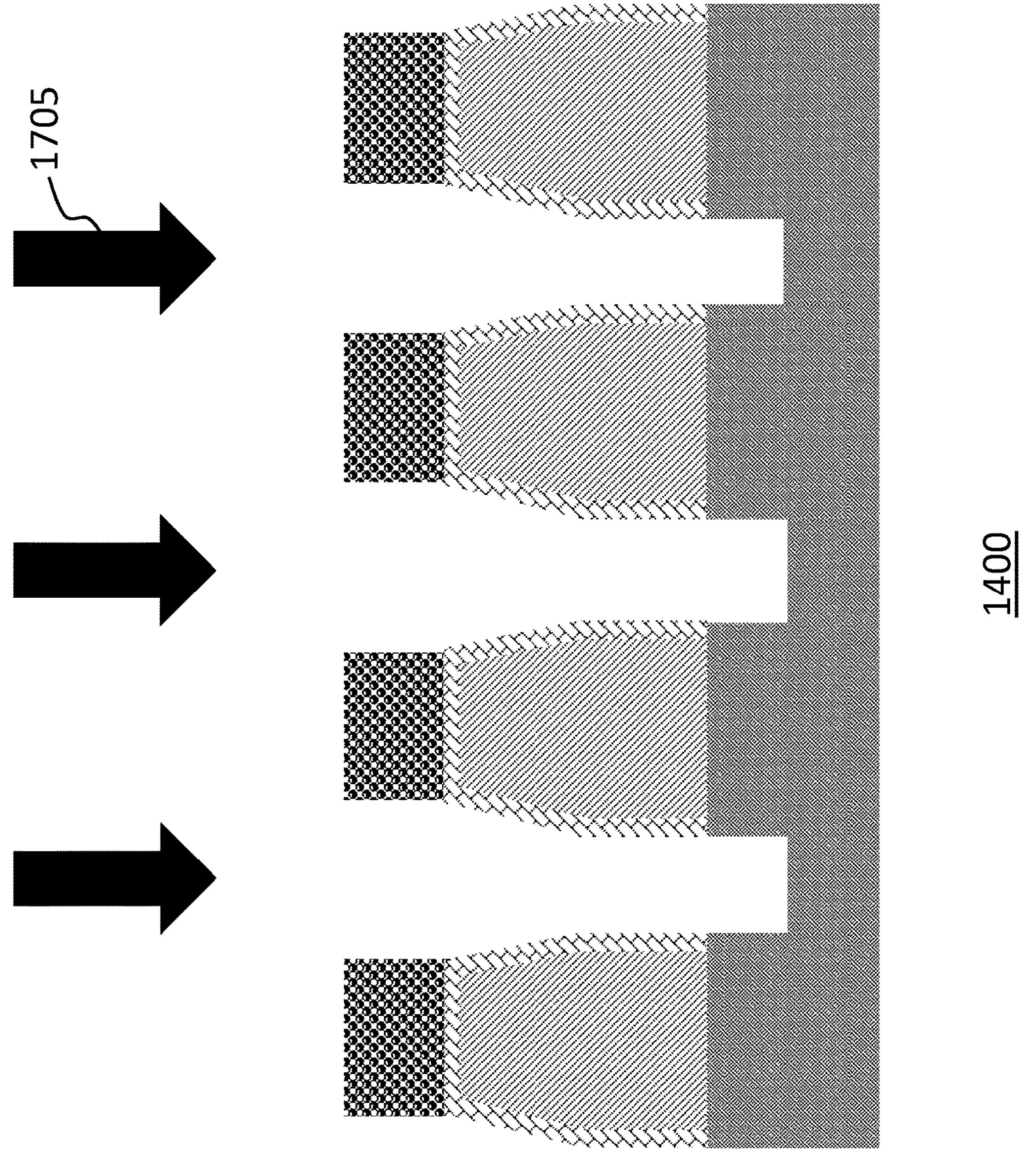

Corresponding to operation 316 of FIG. 3, FIG. 17 is a cross-sectional view of the structure 1400 in which an underlying layer is etched with the lined trimmed feature 1410 (or the lining layer 1505) and the top feature 1605 both serving as a mask, in accordance with various embodiments.

As shown in FIG. 17, an etching process 1705 may be performed to etch an underlying layer with the lined trimmed feature 1410 (or the lining layer 1505) and the top feature 1605 both serving as a mask. In some embodiments, the etching process 1705 may be performed to etch the substrate 1405. In some embodiments, the etching process 1705 may be performed to etch one or more underlying layers (e.g., a dielectric layer) formed on the substrate 1405. In some examples, following the etching process 1705, one or more etching processes (e.g., wet etching, dry etching, etc.) may be used to remove the lining layer 1505 and the top feature 1605.

In some examples, the substrate 1405 may have different configurations for different applications, and the lined trimmed feature 1410 (or the lining layer 1505) and the top feature 1605 may serve as a mask to etch the substrate 1405 with various configurations or one or more underlying layers formed on such a substrate. For example, the substrate 1405 may have a stack of layers alternately formed of different materials. For example, the structure 1400 may be a portion of a 3D NAND memory device, in which the substrate 1405 may include a stack of oxide-nitride-oxide layers. In some examples, the etching process 1705 may be anisotropic or isotropic.

Figure 18:
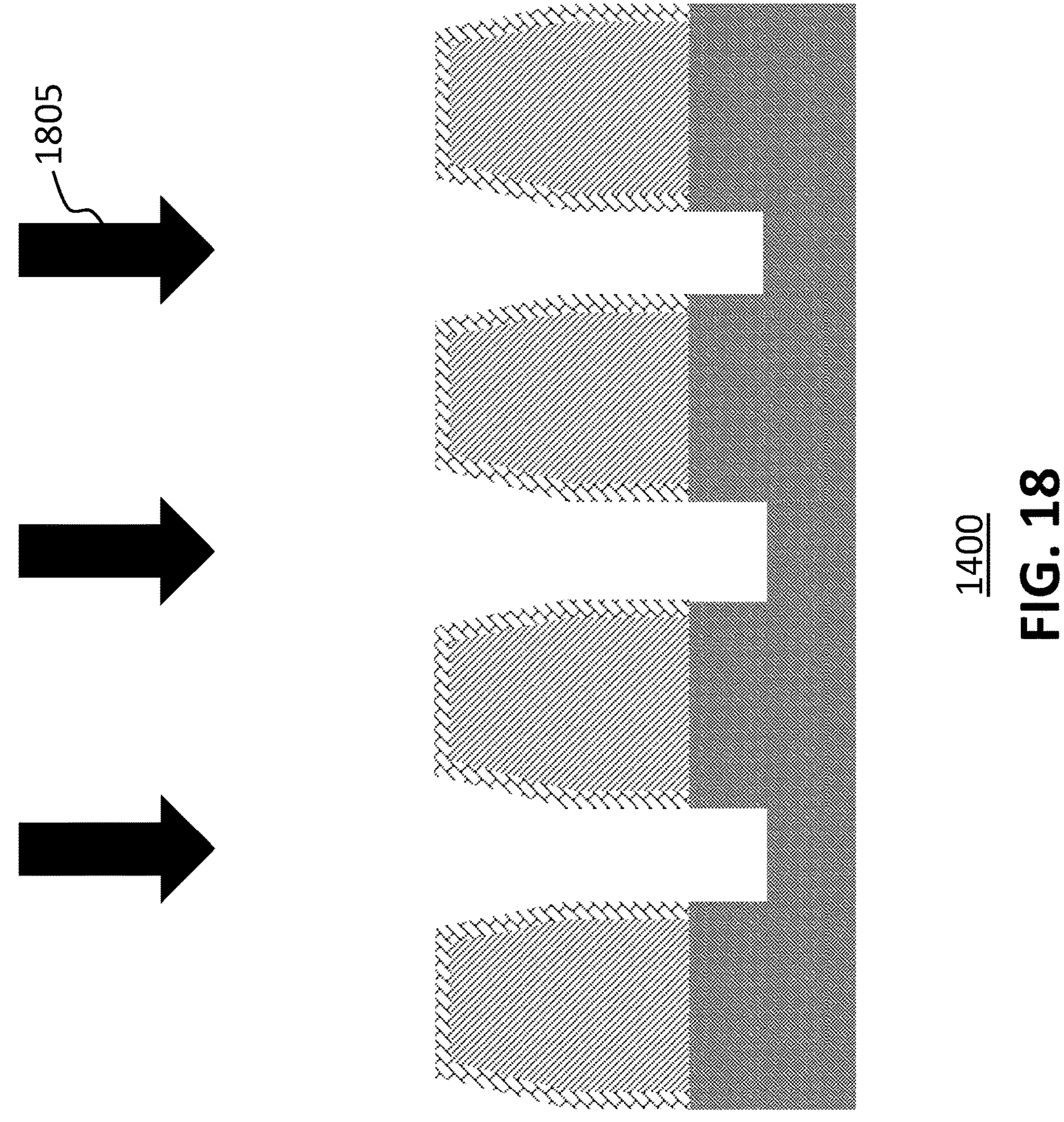

In some examples, the method 300 can continue from operation 312 to operation 316, with operation 314 omitted. That is, an etching process may be performed on the structure 1400 of FIG. 15, as shown in FIG. 18. FIG. 18 is a cross-sectional view of the structure 1400 in which an underlying layer is etched with the lined trimmed feature 1410 (or the lining layer 1505) serving as a mask, in accordance with various embodiments. As shown in FIG. 18, the top feature 1605 is not formed on the lined trimmed feature 1410, which can solely serve as a mask.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for fabricating semiconductor devices, comprising:

forming a first hardmask layer over a substrate;

forming a second hardmask layer over the first hardmask layer;

etching the second hardmask layer to form a pattern in the second hardmask layer;

transferring the pattern to the first hardmask layer;

removing the second hardmask layer and trimming an upper portion of the pattern in the first hardmask layer;

after trimming the upper portion of the pattern in the first hardmask layer, forming a silicon-containing layer on a top surface of the pattern in the first hardmask layer; and etching the substrate with the pattern in the first hardmask layer and the silicon-containing layer both serving as a mask.

2. The method of claim 1, wherein the substrate includes one or more dielectric layers, the first hardmask layer includes an amorphous carbon layer, and the second hardmask layer includes silicon oxynitride.

3. The method of claim 1, wherein the step of forming a silicon-containing layer on a top surface of the pattern in the first hardmask layer further comprises applying a plasma of silicon tetrachloride over the pattern in the first hardmask layer.

4. The method of claim 3, wherein the plasma of silicon tetrachloride is applied with a passivation gas of hydrogen or oxygen.

5. The method of claim 1, following the step of forming a silicon-containing layer on a top surface of the pattern in the first hardmask layer, further comprising forming an aluminum oxide layer lining the pattern in the first hardmask layer and the silicon-containing layer.

6. The method of claim 5, wherein the first hardmask layer further comprises the aluminum oxide layer.

7. The method of claim 5, wherein the aluminum oxide layer is formed using atomic layer deposition.

8. The method of claim 1, prior to the step of forming a silicon-containing layer on a top surface of the pattern in the first hardmask layer, further comprising forming an aluminum oxide layer lining the pattern in the first hardmask layer.

9. The method of claim 8, wherein the mask first hardmask layer further comprises the aluminum oxide layer.

10. The method of claim 8, wherein the aluminum oxide layer is formed using atomic layer deposition.

11. A method for fabricating semiconductor devices, comprising:

forming a first hardmask layer over a substrate;

forming a second hardmask layer over the first hardmask layer;

transferring a pattern of the second hardmask layer to the first hardmask layer;

removing the second hardmask layer and trimming an upper portion of the pattern in the first hardmask layer;

after trimming the upper portion of the pattern in the first hardmask layer, forming a third hardmask layer on a top surface of the pattern in the first hardmask layer; and etching the substrate with the pattern in the first hardmask layer and the third hardmask layer both serving as a mask.

12. The method of claim 11, wherein the third hardmask layer is formed based on a plasma of silicon tetrachloride.

13. The method of claim 11, wherein the substrate includes one or more dielectric layers, the first hardmask layer includes an amorphous carbon layer, the second hardmask layer includes silicon oxynitride, and the third hardmask layer includes silicon.

14. The method of claim 11, following the step of forming a third hardmask layer on a top surface of the pattern in the first hardmask layer, further comprising forming an aluminum oxide layer lining the pattern in the first hardmask layer and the third hardmask layer.

15. The method of claim 14, wherein the first hardmask layer further comprises the aluminum oxide layer.

16. The method of claim 11, prior to the step of forming a third hardmask layer on a top surface of the pattern in the first hardmask layer, further comprising forming an aluminum oxide layer lining the pattern in the first hardmask layer.

17. The method of claim 16, wherein the first hardmask layer further comprises the aluminum oxide layer.

18. A method for fabricating semiconductor devices, comprising:

forming an amorphous carbon layer over one or more dielectric layers;

forming a patterned hardmask layer over the amorphous carbon layer;

transferring a pattern of the patterned hardmask layer to the amorphous carbon layer;

removing the patterned hardmask layer and trimming an upper portion of the pattern in the amorphous carbon layer;

after trimming the upper portion of the pattern in the amorphous carbon layer, forming a silicon-containing layer on a top surface of the pattern in the amorphous carbon layer; and etching the one or more dielectric layers with the pattern in the amorphous carbon layer and the silicon-containing layer both serving as a mask.

19. The method of claim 18, following the step of forming a silicon-containing layer on a top surface of the pattern in the amorphous carbon layer, further comprising forming an aluminum oxide layer lining the pattern in the amorphous carbon layer and the silicon-containing layer.

20. The method of claim 18, prior to the step of forming a silicon-containing layer on a top surface of the pattern in the amorphous carbon layer, further comprising forming an aluminum oxide layer lining the pattern in the amorphous carbon layer.

* * * * *